United States Patent [19]

Kondo et al.

[11] Patent Number: 4,817,057
[45] Date of Patent: Mar. 28, 1989

[54] SEMICONDUCTOR MEMORY DEVICE HAVING IMPROVED PRECHARGE SCHEME

[75] Inventors: Kenji Kondo; Yasuhiko Rai, both of Tokyo, Japan

[73] Assignee: NEC Corporation, Tokyo, Japan

[21] Appl. No.: 15,465

[22] Filed: Feb. 17, 1987

[30] Foreign Application Priority Data

Feb. 17, 1986 [JP] Japan .................... 61-33274

[51] Int. Cl.$^4$ ........................ G11C 7/00; G11C 8/00
[52] U.S. Cl. .................................. 365/203; 365/230; 365/233
[58] Field of Search .............. 365/189, 203, 207, 230, 365/233

[56] References Cited

U.S. PATENT DOCUMENTS

| | | | |
|---|---|---|---|
| 4,417,328 | 11/1983 | Ochii .................. | 365/203 |
| 4,592,026 | 5/1986 | Matsukawa et al. ........ | 365/203 |
| 4,625,298 | 11/1986 | Sumi .................... | 365/203 |
| 4,661,931 | 4/1987 | Flannagan et al. ........ | 365/203 |

FOREIGN PATENT DOCUMENTS

| | | | |
|---|---|---|---|
| 2097623A | 11/1982 | United Kingdom ........ | 365/203 |
| 2127640A | 4/1984 | United Kingdom ........ | 365/203 |

Primary Examiner—Terrell W. Fears
Assistant Examiner—Melissa J. Koval
Attorney, Agent, or Firm—Sughrue, Mion, Zinn, Macpeak & Seas

[57] ABSTRACT

A semiconductor memory device provided with an improved precharge scheme for bit lines is disclosed. A plurality of bit lines are divided into a plurality of bit line group and a precharge control signal is applied only to precharge transistors in a selected bit line group.

6 Claims, 6 Drawing Sheets

4,817,057

SEMICONDUCTOR MEMORY DEVICE HAVING IMPROVED PRECHARGE SCHEME

BACKGROUND OF THE INVENTION

The present invention relates to a semiconductor memory device in which a pair of bit lines are precharged prior to a read or write operation.

As is well known, a semiconductor memory is structured in that a plurality of memory cells are provided in rows and columns, and word lines and bit line pairs are arranged in rows and columns, respectively. Each of the bit line pairs is composed of a pair of bit lines, and each of the pair of bit lines are equally precharged to a predetermined potential prior to a read or write operation. This precharge of bit lines is conducted by providing precharge transistors between bit lines and a voltage source of the predetermined potential and rendering the precharge transistors conductive.

However, accompanied by the increase in memory capacity, the number of bit lines pairs has been remarkably increased, and this increase in memory capacity has also caused the increase in the number of the precharge transistors for precharging bit lines in each bit line pair. The precharge transistors are simultaneously rendered conductive by a precharge control signal commonly applied to gates of the precharge transistors. Therefore, effective capacitance of the gates of the precharge transistors has inevitably become large. In other words, a load capacitance of the precharge control signal has become large. Accordingly, it has been difficult to drive the precharge transistors at a high speed in response to the precharge control signal and therefore, a time period required to complete the precharge has become large, resulting in low speed operation of memories.

SUMMARY OF THE INVENTION

It is one object of the present invention to provide a semiconductor memory device operable at a high speed.

It is another object of the present invention to provide a semiconductor memory device provided with a high speed precharging scheme.

The semiconductor memory device according to the present invention comprises a plurality of memory cells provided in rows and columns, word lines and a plurality pairs of bit lines arranged in rows and columns, respectively, a plurality of precharge transistors coupled between the respective bit lines and a precharge potential source and a control circuit for operatively generating a precharge control signal for rendering the precharge transistors conductive, and is featured in that the plurality pairs of bit lines are divided into a plurality bit of line groups, and the precharge control signal is selectively applied only to the precharge transistors belonging to selected one of the bit line groups while the precharge control signal is not applied to the precharge transistors belonging to the remaining non-selected bit line group.

According to the present invention, the precharge control signal is applied to only a part of the whole precharge transistors and therefore, effective capacitance load on the precharge control signal can be remarkably reduced. As a result, the selected group of bit lines can be precharged at a high speed.

DETAILED DESCRIPTION OF THE INVENTION

Figure 1:
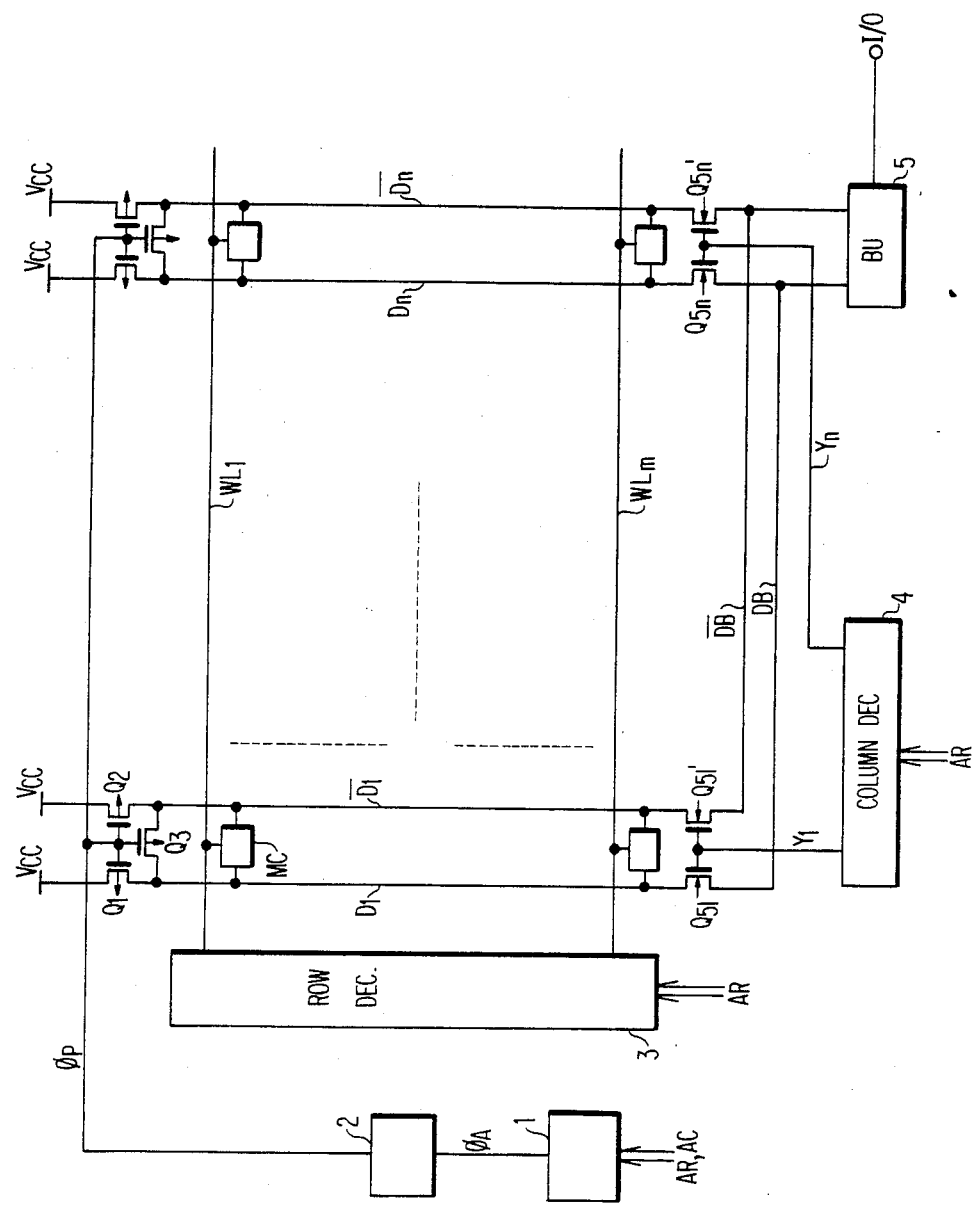
FIG. 1 is a schematic block diagram showing a memory device according to the prior art.

FIG. 1 shows the memory device according to a prior art. A plurality of word lines $WL_l$ to $WL_m$ are arranged in rows while a plurality of pairs of bit lines $(D_l, \overline{D}_l)$ to $(D_n, \overline{D}_n)$ are arranged in columns. A plurality of static type memory cells MC are provided in a matrix form of rows and columns in a known way. A row decoder 3 receives row address signals AR and selects one of the word lines in response to a control signal $\phi_1$. Each pair of bit lines are provided with precharge transistors $Q_1$, $Q_2$ and $Q_3$. Also, the pairs of bit lines are connected to a pair of bus lines DB and $\overline{DB}$ through transfer gate transistors $(Q_{51}, Q_{51}')$ to $(Q_{5n}, Q_{5n}')$, respectively, which are controlled by a column decoder 4 receiving column address signals AC and a control signal $\phi_2$. The bus lines DB and $\overline{DB}$ are connected to a buffer circuit 5 connected to an input/output terminal I/O.

An address transistor detection circuit 1 receives both the row address signals AR and the column address signals AC and generates a detection signal $\phi_A$ when at least one of the row and column address signals has changed. All the precharge transistors $Q_1$ to $Q_3$ for the respective bit lines are controlled by a precharge control signal $\phi_p$. A timing signal generating circuit 2 generates the precharge control signal $\phi_p$, and the timing signals $\phi_1$ and $\phi_2$ in a predetermined sequence in response to the detection signal $\phi_A$.

When at least one of the address signals has changed and a new access operation is about to start, the detection signal $\phi_A$ is generated and the precharge signal $\phi_P$ is generated immediately after the generation of $\phi_A$. Therefore, all the precharge transistors $Q_1$ to $Q_3$ are rendered conductive so that all the bit lines are equally precharged to a power voltage $V_{CC}$. After disappearance of $\phi_P$, the signals $\phi_1$ and $\phi_2$ are sequentially generated so that the row decoder 3 selects one word line and the column decoder 4 selects one pair of bit lines by conducting one pair of transfer gates e.g. $Q_{51}$, $Q_{51}'$. Thus, true and complementary read signals are transmitted to the bus lines DB and $\overline{DB}$ for reading out.

However, the precharge signal $\phi_P$ is commonly applied to gates of all the precharge transistors $Q_1$ to $Q_3$ in the respective columns and therefore load capacitance associated to the signal $\phi_P$ is very large. Accordingly, it is difficult to switch all the precharge transistors at a high speed by the signal $\phi_P$, resulting in low speed operation. Referring to FIGS. 2 to 7, a memory device according to one embodiment of the present invention is explained below.

Figure 2:
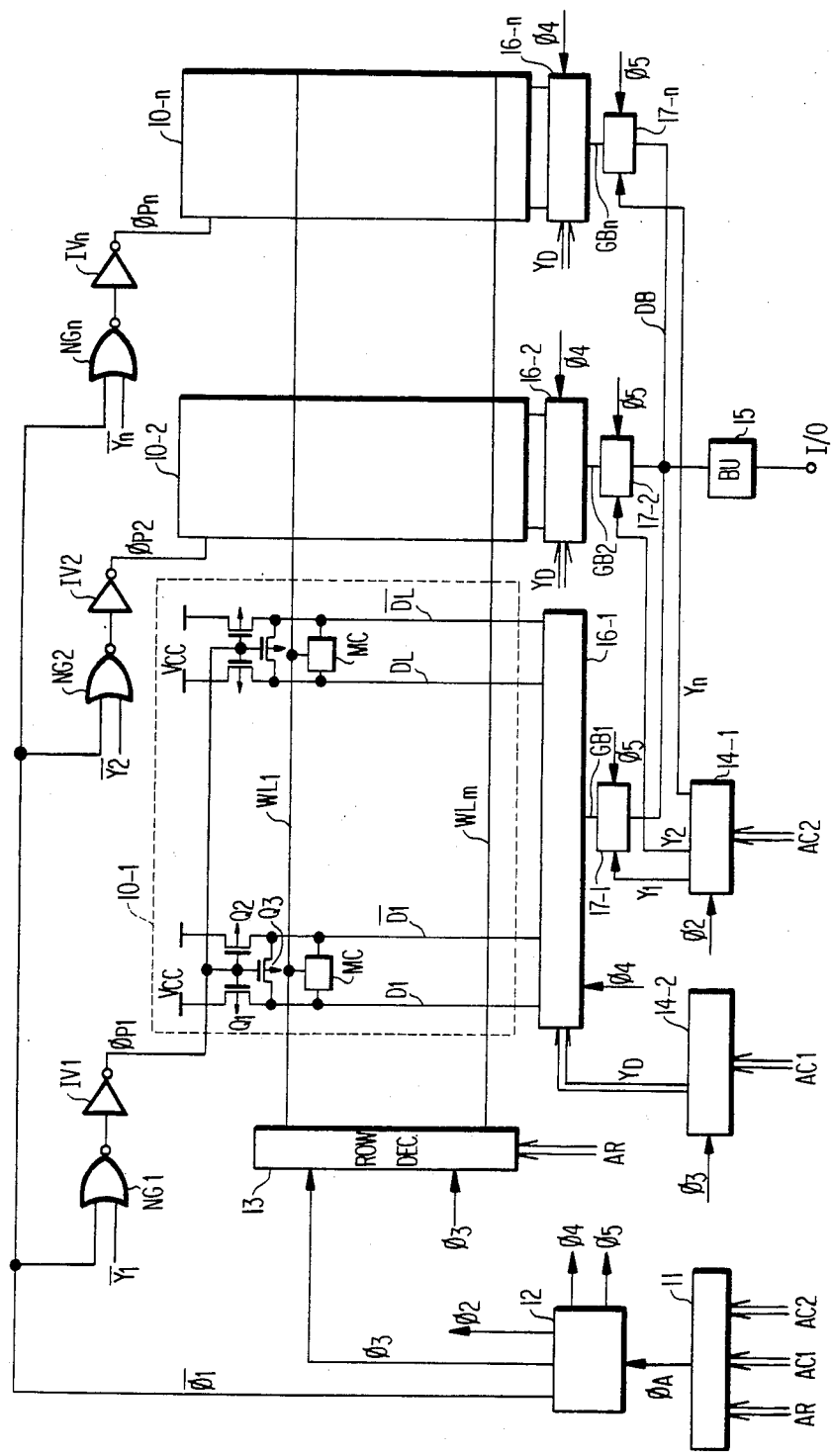
FIG. 2 is a schematic block diagram according to a first embodiment of the present invention.

FIG. 2 shows a major structure of the memory according to the embodiment.

Figure 4:
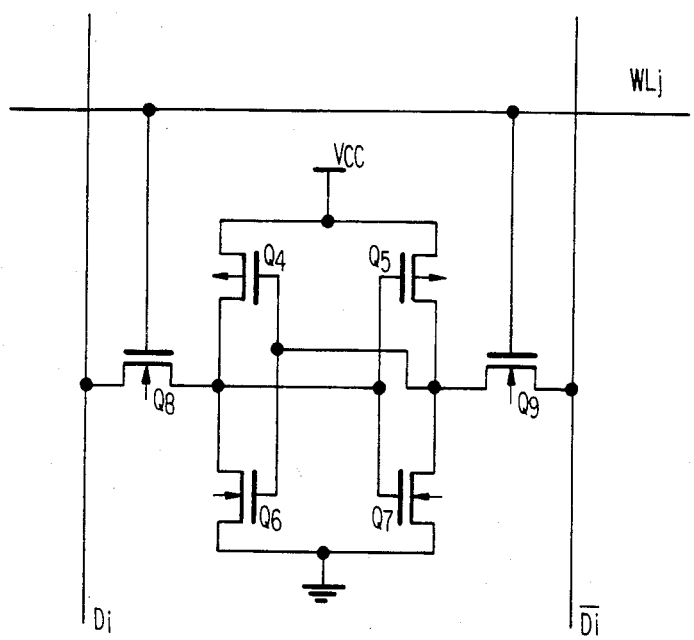
FIG. 4 is a schematic circuit diagram showing an example of memory cells employed in the memory of FIG. 2.
Figure 5:
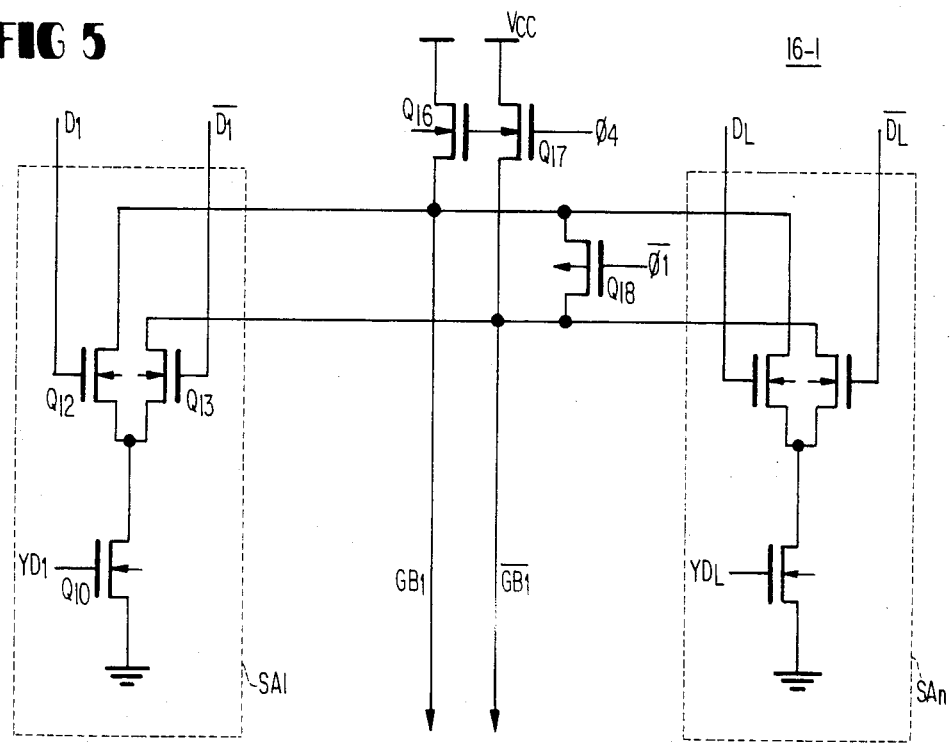
FIG. 5 is a schematic circuit diagram of a bit line selection circuit.
Figure 6:
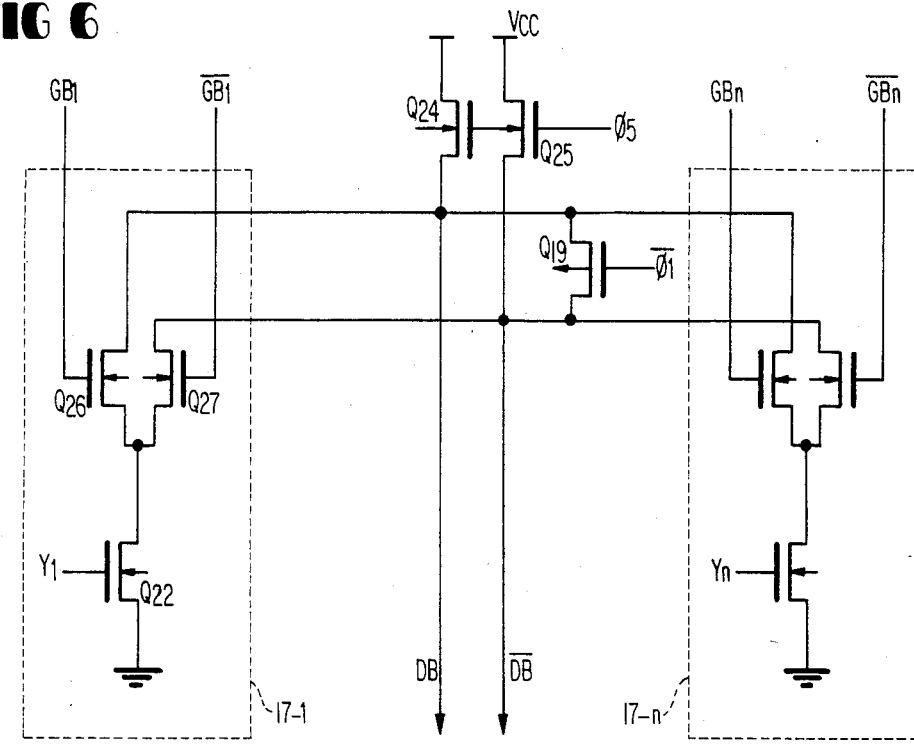
FIG. 6 is a schematic circuit diagram of group selection circuits in FIG. 2.

A plurality pairs of bit lines are divided into a plurality of bit line groups 10-1 to 10-n. As being represented by the group 10-1, each of the groups 10-1 to 10-n includes a plurality of pairs of bit lines $D_l$, $\overline{D}_l$ to $D_L$, $\overline{D}_L$, a plurality sets of precharge (P-channel type) transistors $Q_1$ to $Q_3$ provided for the respective bit line pairs, a plurality of word lines $WL_l$ to $WL_m$ extending over all the bit line groups, and a plurality of static type memory cells MC. Each of memory cells MC is composed of P-channel transistors $Q_4$ and $Q_5$, N-channel transistors $Q_6$ to $Q_9$, as shown in FIG. 4. A row decoder 13 selects one of the word lines in response to now address signals AR when a timing signal $\phi_3$ is activated.

Bit line selection circuits 16-1 to 16-n are provided for the bit line groups 10-1 to 10-n respectively. Each of the bit line selection circuits 16-1 to 16-n receives first column decoder signals YD ($YD_l \ldots YD_L$) generated by a first column decoder 14-2 receiving a first part AC1 of column address signals in response to $\phi_3$ and selects one pair of bit lines and outputs data on the selected pair of bit lines to each of outputs $GB_l$ to $GB_n$. Group selection circuits 17-1 to 17-n receive second column decoder signals $Y_l$ to $Y_n$, respectively and one of them is selected by $Y_l$ to $Y_n$ so that data on the selected outputs $GB_l$ to $GB_n$ is transmitted to a bus line DB connected to an output buffer 15. The bit selection circuit 16-1 is composed of a plurality of gate differential amplifiers $SA_l$ to $SA_n$ provided for the pairs of bit lines $D_l$, $\overline{D}_l$ to $D_n$, $\overline{D}_n$, each composed of N-channel field effect transistors $Q_{10}$, $Q_{12}$ and $Q_{13}$, a pair of N-channel load transistors $Q_{16}$ and $Q_{17}$ controlled by $\phi_4$ and a P-channel reset transistor $Q_{18}$ controlled by $\phi_1$. When the pair of bit lines $D_l$, $\overline{D}_l$ are selected, the decoder signal $Y_l$ assumes a high level so that the sense amplifier SA1 is enabled. As a result, data on the selected pair of bit lines $D_l$ and $\overline{D}_l$ are transmitted to $GB_l$ and $\overline{GB}_l$. Each of the group selection circuits 17-1 to 17-n is composed of a gated differential amplifier made of N-channel transistors $Q_{26}$ to $Q_{27}$. A pair of N-channel load transistors $Q_{24}$ and $Q_{25}$ and a P-channel reset transistor $Q_{19}$ are commonly provided for the circuits 17-1 to 17-n.

Figure 3:
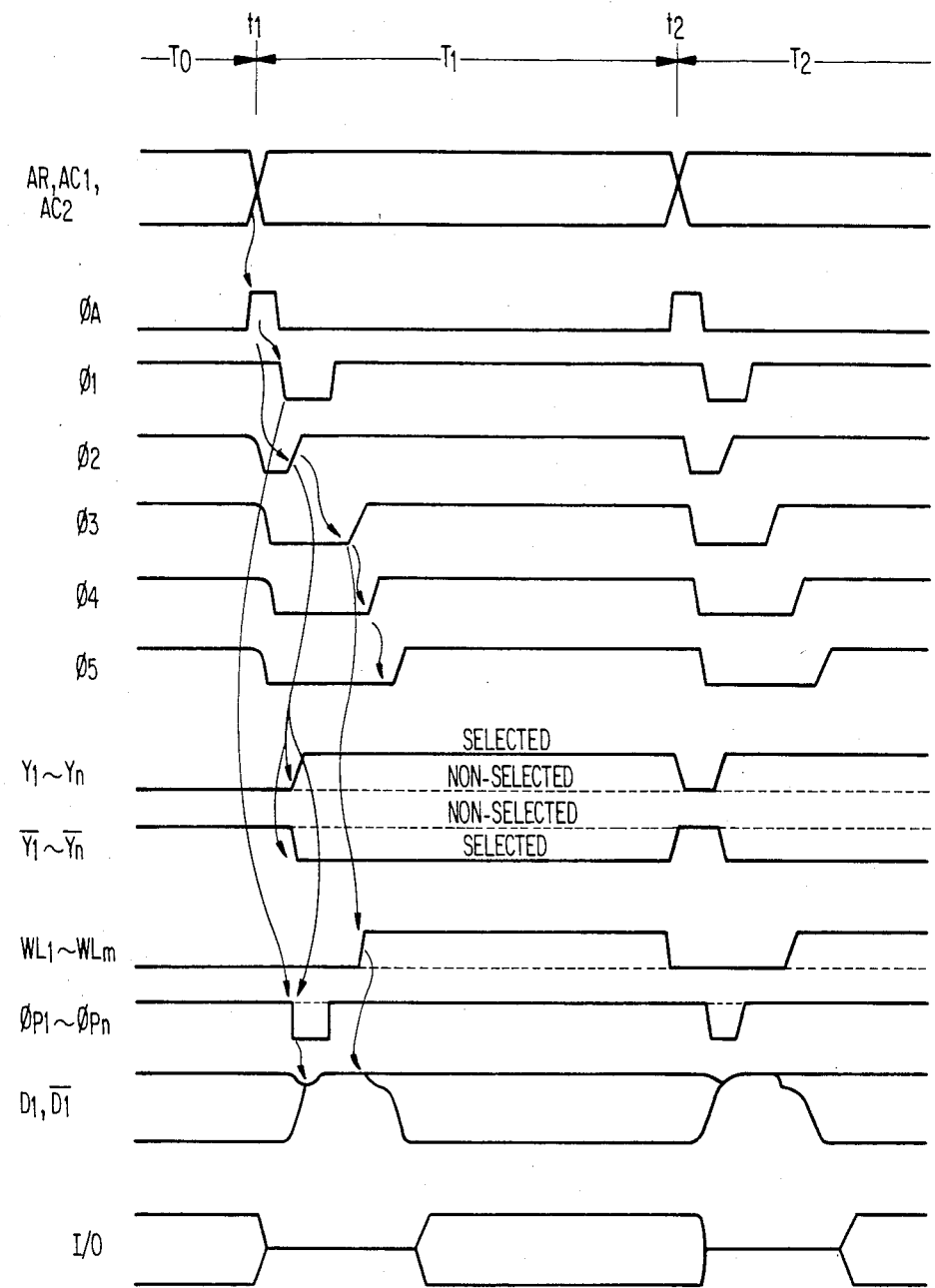
FIG. 3 is a timing diagram showing operations of the memory of FIG. 2.
Figure 7:
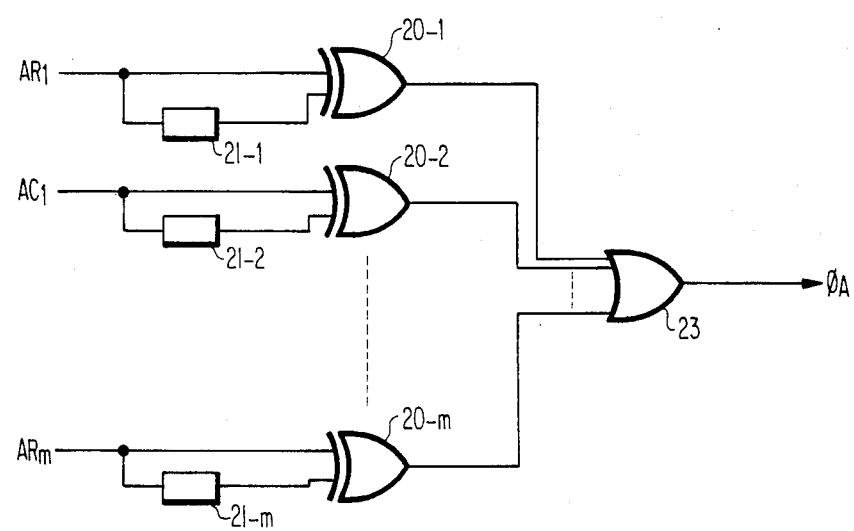
FIG. 7 is a schematic circuit diagram of an address transistor detection circuit in FIG. 2.

The decoder signal $Y_l$ to $Y_n$ are generated by a second column decoder 14-1 receiving a second remaining part AC2 of the column address signals in response to a timing signal $\phi_2$. An address transistor detection circuit 11 receives all the row address signals AR and the column address signals AC1 and AC2 and generates a detection signal $\phi_A$ when at least one address signal has changed. One example of circuit structure of the detection circuit 11 is shown in FIG. 7. For all the row address signals $AR_l \ldots AR_m$ and all the column address signals $AC_1 \ldots$, delay circuits 21-1 to 21-m and exclusive OR gates 20-1 to 20-m are provided. Outputs of the exclusive OR gates 20-1 to 20-m are inputted to an OR circuit 23 from which the detection signal $\phi_A$ is generated. For example, the exclusive OR circuit 20-1 receives a row address signal AR1 and its delayed signal from the delay circuit 21-1. When the signal AR1 has changed the signal AR1 itself becomes different from its delayed signal, the circuit 20-1 generates a pulse which is then outputted as $\phi_A$ via the OR gate 23. A timing signal generating circuit 12 generates a precharge control signal $\phi_1$, timing signals $\phi_2$, $\phi_3$, $\phi_4$ and $\phi_5$, as illustrated in FIG. 3. The precharge control $\phi_1$ is applied to inputs of NOR gates $NG_l$ to $NG_n$ which receive inverted column decoder signals $\overline{Y}_l$ to $\overline{Y}_n$, respectively. The signal $\phi_1$ and $\overline{Y}_l$ to $\overline{Y}_n$ are low active signals. Namely, when they assume low levels when they are energized or selected. The outputs of the NOR gates $NG_l$ to $NG_n$ are inputted to inverters $IV_l$ to $IV_n$, respectively, and outputs $\phi_{Pl}$ to $\phi_{Pn}$ of the inverters $IV_l$ to $IV_n$ are supplied to the precharge transistors $Q_1$ to $Q_3$ of the bit line groups 10-1 to 10-n, respectively. Therefore, when the bit line group 10-1 is about to be selected for reading therefrom or writing thereto in response to a high level of $Y_l$ (a low level of $\overline{Y}_l$), the circuit 11 generates $\phi_A$ and thereafter the circuit 12 generates a low level of $\phi_1$. Since among the inverted decoder signal $\overline{Y}_l$ to $\overline{Y}_n$, only $\overline{Y}_l$ is rendered low in level with others high in level, so that only the NOR gate $NG_l$ generates a high level output and the inverter $IV_l$ generates a low level of $\phi_{Pl}$. As a result, the precharge transistors $Q_1$ to $Q_3$ for the respective bit line pairs only in the bit line group 10-1 are rendered conductive and the bit lines in the group 10-1 are precharged to $V_{CC}$. While other inverted decoder signals $\overline{Y}_2$ to $\overline{Y}_n$ are high in level and the signals $\phi_{P2}$ to $\phi_{Pn}$ are high. Therefore, the precharge transistors ($Q_1$ to $Q_3$) of the non-selected bit line groups 10-2 to 10-n are non-conductive and precharge is not achieved in the non-selected bit line groups 10-2 to 10-n. Referring to FIG. 3, a typical read operation is explained.

At a time point $t_1$, at least one of the row and column address signals AR, AC1 and AC2 has changed. This means that new access cycle is about to commence. In response to this change in address signals, the detection signal $\phi_A$ is generated and thereafter the signals $\phi_1$, $\phi_2$ to $\phi_5$ are generated as illustrated. Namely, $\phi_1$ is first rendered low and $\phi_2$ is changed to a high level. Therefore, the decoder signal $Y_l$ to $Y_n$ and their inverted signals $\overline{Y}_l$ to $\overline{Y}_n$ are developed. In response to this, the states of the signals $\phi_{Pl}$ to $\phi_{Pn}$ are also developed. Accordingly, the precharge transistors $Q_1$ to $Q_3$ in the selected bit line group are rendered conductive so that the bit lines in the selected bit line group are precharged to $V_{CC}$, as representatively illustrated by waveforms of Dl and $\overline{Dl}$. Then, in response to $\phi_3$, the row decoder 13 selects one of the word lines $WL_l$ to $WL_m$ and the first column decoder 14-2 selects one of the bit line pair in the respective bit line groups. Therefore, the pair of bit lines Dl, $\overline{Dl}$ are changed in level according to stored data of a selected memory cell and a potential change is amplified if selected. Through the selected one of the selection circutis 17-1 to 17-n, the data from the selected bit line group are outputted to I/O.

According to the present invention, precharge of the bit lines is performed only in the selected bit line group, and the precharge control signal $\phi_1$ is applied only to the precharge transistors in the selected bit line group, and therefore, an effective capacitance loaded on the precharge control signal $\phi_1$ is made small to enable a high speed precharge operation. Furthermore, a power consumption caused by the precharge is remarkably reduced.

Figure 8:
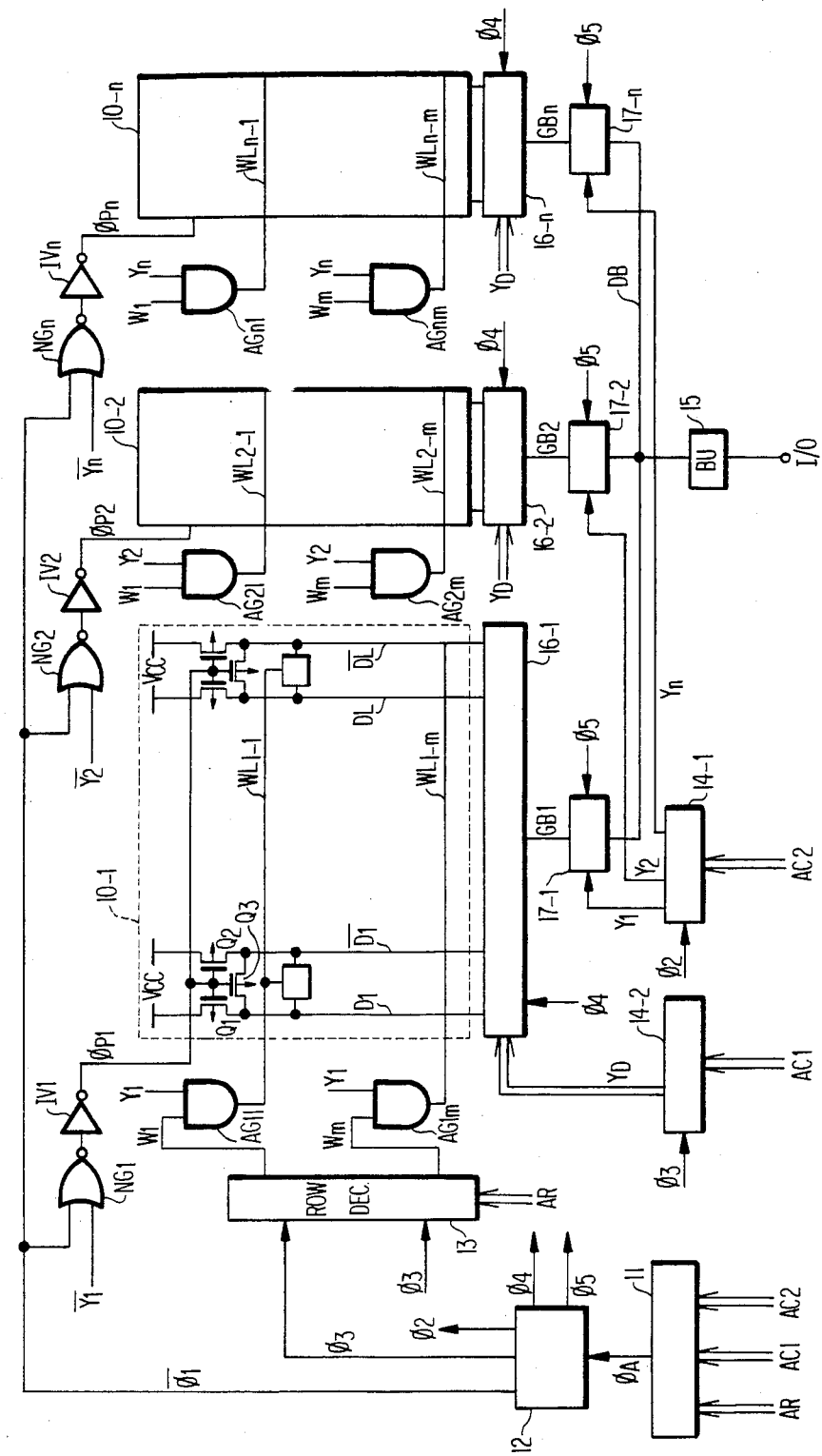
FIG. 8 is a block diagram showing a memory device according to a second embodiment of the present invention.

FIG. 8 shows another embodiment of the invention.

This embodiment is featured in that the bit line groups 10-1 to 10-n include separate word lines ($WL_{l-l}$ to $WL_{l-m}$) to ($WL_{n-l}$ to $WL_{n-m}$), respectively. The word decoder signals $W_l$ to $W_m$ are applied to the word lines of the bit line groups 10-1 to 10-n through a plurality sets of AND gates ($AG_{ll}$—$AG_{lm}$) to ($AG_{n-}$ $l$—$AG_{nm}$), as illustrated. In other words, the word lines in the selected bit line group are subjected to a word line selection. For example, when the bit line group 10-1 is to be selected, the AND gates $AG_{ll}$ to $AG_{lm}$ are conditioned by a high level of $Y_l$ so that one of the word lines $WL_{l-1}$ to $WL_{l-m}$ is selected by the decoder signals $W_l$ to $W_m$.

According to this embodiment, each of the word lines is made far shorter than the case of FIG. 2, the effective capacitance associated to the respective word lines is remarkably reduced. Thus, a high speed operation can be further enhanced.

The present invention has been explained by way of examples of static type memory device. However, the present invention is also applicable to any type memories in which bit lines are precharged.

We claim:

1. A semiconductor memory device comprising:
a plurality of memory blocks, each of said memory blocks including a plurality of word lines arranged in rows, a plurality of bit lines arranged in columns, and a plurality of memory cells coupled to the word lines and bit lines;
a plurality of column selection circuits, each of the plurality of column selection circuits being provided for a different one of said memory blocks, and being operable for selecting at least one of the bit lines of its associated memory block in accordance with first address information;
a memory block selection circuit, coupled to said plurality of column selection circuits, for selecting one of said memory blocks in accordance with second address information to thereby derive data of the at least one bit line of the selected memory block;
a word line selection circuit, coupled to said plurality of memory blocks, for selecting one of the word lines of at least the selected memory block in accordance with third address information;
a plurality of precharge circuits, each of said precharge circuits being provided for a different one of said memory blocks, and being operable for precharging the bit lines of its associated memory block to a predetermined potential; and
a precharge control circuit, coupled to said plurality of precharge circuits, for enabling only one of said precharge circuits in accordance with said second address information, and for disenabling the remaining precharge circuits, said enabled precharge circuit being coupled to the selected memory block, whereby the bit lines of the selected memory block are precharged by the enabled precharge circuit while the bit lines of the remaining non-selected memory block are not precharged.

2. The memory device according to claim 1, in which said word line selection circuit selects one of the word lines in each of said memory blocks.

3. The memory device according to claim 1, in which said word line selection circuit selects one of the word lines in only the selected memory block.

4. The memory device according to claim 1, in which said precharge control circuit includes first means for generating a timing signal in response to a change of at least one of said first to third address information, and a plurality of gates, each of said plurality of gates being provided for a different one of said precharge circuits, and each of said gates receiving said timing signal and being controlled by said second address information.

5. The memory device according to claim 1, in which one of said precharge circuits is enabled before said word line selection circuit selects one of the word lines.

6. A semiconductor memory device, comprising:
first means for receiving first address information;
second means for receiving second address information;
third means, coupled to said first and second means, for generating a first timing signal, and for generating a second timing signal after said first timing signal in response to a change of at least one of said first and second address information;
a plurality of memory blocks, each of said memory blocks including a plurality of word lines arranged in rows, a plurality of bit lines arranged in columns, and a plurality of memory cells coupled to the word lines and the bit lines;
a block selection circuit, coupled to said first means and to said plurality of memory blocks, for selecting one of said memory blocks in accordance with said first address information;
a row selection circuit, coupled to said memory blocks, and being responsive to said second timing signal, for selecting one of the word lines of at least the selected memory block in accordance with said second address information;
a plurality of precharge circuits, each of the plurality of precharge circuits being provided for a different one of said memory blocks, and being operable for precharging the bit lines of its associated memory block to a predetermined potential; and
a precharge control circuit coupled to said plurality of precharge circuits, said precharge control circuit being responsive to said first timing signal for rendering operable that one of said precharge circuits which is coupled to the selected memory block, and for disenabling those precharge circuits coupled to the non-selected memory blocks, whereby only the bit lines of the selected memory block are precharged.

* * * * *

UNITED STATES PATENT AND TRADEMARK OFFICE
CERTIFICATE OF CORRECTION

PATENT NO. : 4,817,057

DATED : March 28, 1989

INVENTOR(S) : Kondo et al

It is certified that error appears in the above-identified patent and that said Letters Patent is hereby corrected as shown below:

Col. 4, line 1, delete "$\phi_1$" and insert --$\overline{\phi}_1$--

Col. 4, line 2, delete "$\phi_1$" and insert --$\overline{\phi}_1$--

Col. 4, line 5, delete "$\phi_1$" and insert --$\overline{\phi}_1$--

Col. 4, line 16, delete "$\phi_1$" and insert --$\overline{\phi}_1$--

Col. 4, line 34, delete "$\phi_1$" and insert --$\overline{\phi}_1$--

Col. 4, line 35, delete "$\phi_5$" and insert --$\overline{\phi}_5$--

Col. 4, line 51, delete "circutis" and insert --circuits--

Col. 4, line 55, delete "$\phi_1$" and insert --$\overline{\phi}_1$--

Col. 4, line 58, delete "$\phi_1$" and insert --$\overline{\phi}_1$--

UNITED STATES PATENT AND TRADEMARK OFFICE
CERTIFICATE OF CORRECTION

PATENT NO. : 4,817,057

DATED : March 28, 1989

INVENTOR(S) : Kondo et al

It is certified that error appears in the above-identified patent and that said Letters Patent is hereby corrected as shown below:

Col. 4, line 51, delete "circutis" and insert —circuits—

Col. 4, line 55, delete "$\phi_1$" and insert —$\overline{\phi}_1$—

Col. 4, line 58, delete "$\phi_1$" and insert —$\overline{\phi}_1$—

Signed and Sealed this

Seventh Day of August, 1990

Attest:

HARRY F. MANBECK, JR.

Attesting Officer  Commissioner of Patents and Trademarks